(12) United States Patent
Yamanaka et al.

(10) Patent No.: US 10,418,496 B2
(45) Date of Patent: Sep. 17, 2019

(54) PHOTODIODE ARRAY

(71) Applicant: HAMAMATSU PHOTONICS K.K., Hamamatsu-shi, Shizuoka (JP)

(72) Inventors: Tatsumi Yamanaka, Hamamatsu (JP); Akira Sakamoto, Hamamatsu (JP); Noburo Hosokawa, Hamamatsu (JP)

(73) Assignee: HAMAMATSU PHOTONICS K.K., Hamamatsu-si, Shizuoka (JP)

( * ) Notice: Subject to any disclaimer, the term of this patent is extended or adjusted under 35 U.S.C. 154(b) by 0 days.

(21) Appl. No.: 14/647,263

(22) PCT Filed: Nov. 26, 2013

(86) PCT No.: PCT/JP2013/081788
§ 371 (c)(1),
(2) Date: May 26, 2015

(87) PCT Pub. No.: WO2014/084212
PCT Pub. Date: Jun. 5, 2014

(65) Prior Publication Data
US 2015/0311358 A1  Oct. 29, 2015

(30) Foreign Application Priority Data
Nov. 28, 2012  (JP) ................... 2012-260066

(51) Int. Cl.
*H01L 27/146*  (2006.01)
*H01L 31/0224*  (2006.01)
(Continued)

(52) U.S. Cl.
CPC ........... *H01L 31/022408* (2013.01); *H01L 27/14663* (2013.01); *H01L 31/103* (2013.01)

(58) Field of Classification Search
CPC ... H01L 27/14; H01L 27/144; H01L 27/1463; H01L 27/1446; H01L 27/14609;
(Continued)

(56) References Cited

U.S. PATENT DOCUMENTS 6,541,755 B1 * 4/2003 Fujita .................... B82Y 20/00
                                                    250/214.1
7,057,254 B2 * 6/2006 Bui .................. H01L 27/14601
                                                    257/414
(Continued)

FOREIGN PATENT DOCUMENTS

CN      1685513 A      10/2005
CN      1759484 A       4/2006
(Continued)

OTHER PUBLICATIONS

English-language translation of International Preliminary Report on Patentability (IPRP) dated Jun. 11, 2015 that issued in WO Patent Application No. PCT/JP2013/081788.
(Continued)

*Primary Examiner* — Natalia A Gondarenko
(74) *Attorney, Agent, or Firm* — Drinker Biddle & Reath LLP

(57) ABSTRACT

A photodiode array includes a plurality of photodiodes formed in a semiconductor substrate. Each of the photodiodes includes a first semiconductor region of a first conductivity type, a second semiconductor region of the first conductivity type, provided with respect to the first semiconductor region on one surface side of the semiconductor substrate, and having an impurity concentration higher than an impurity concentration of the first semiconductor region, a third semiconductor region of a second conductivity type, provided with respect to the first semiconductor region on the one surface side so as to surround the second semiconductor region separately from the second semiconductor
(Continued)

region, and constituting a light detection region together with the first semiconductor region, and a through-electrode provided within a through-hole passing through the first semiconductor region and the second semiconductor region, and electrically connected to the third semiconductor region.

8 Claims, 16 Drawing Sheets

(51) Int. Cl.
*H01L 31/0352* (2006.01)
*H01L 31/103* (2006.01)

(58) Field of Classification Search
CPC ......... H01L 27/14658; H01L 27/14667; H01L 27/305; H01L 51/002; H01L 51/441; H01L 31/00; H01L 31/10; H01L 27/0255; H01L 27/0814; H01L 27/0623–0635; H01L 27/0647; H01L 27/0652; H01L 27/0664–0676; H01L 27/0711–0727; H01L 27/14659; H01L 27/075–0766; H01L 27/0788; H01L 27/0266; H01L 27/0259; H01L 27/14643–14663; H01L 2224/05552; H01L 23/5384; H01L 25/167; H01L 31/107; H01L 21/768–76898; H01L 21/02063; H01L 21/76816; H01L 21/76877–76883; H01L 21/76897; H01L 21/486; H01L 2221/1031; H01L 2221/1036; H01L 2224/05085–05098; H01L 2224/8203–82047; H01L 2225/06541; H01L 2225/0654; H01L 2223/6616–6622; H01L 31/02; H01L 31/022408; H01L 31/0203; H01L 31/08; H01L 27/14669; H01L 27/14632; H01L 27/1464; H01L 27/14683; H01L 27/148; H01L 27/156; H01L 2224/45015; H01L 2924/12043; H01L 23/49827; H01L 2225/06544
USPC ......... 257/448, 443, 44, 245, 222, 438, 431, 257/458; 438/59, 98, 73, 91
See application file for complete search history.

(56) References Cited

U.S. PATENT DOCUMENTS

| | | | |
|---|---|---|---|
| 2004/0129992 A1* | 7/2004 | Shibayama | H01L 27/14643 257/443 |
| 2008/0067622 A1 | 3/2008 | Bui et al. | |
| 2008/0099871 A1* | 5/2008 | Bui | H01L 27/1443 257/461 |
| 2009/0108391 A1* | 4/2009 | Kuriyama | H01L 27/14636 257/448 |
| 2010/0200940 A1* | 8/2010 | Ji | H01L 27/14634 257/431 |
| 2011/0169116 A1* | 7/2011 | Nanver | H01L 31/022408 257/429 |
| 2014/0312449 A1* | 10/2014 | Jonak-Auer | H01L 27/14609 257/438 |

FOREIGN PATENT DOCUMENTS

| | | |
|---|---|---|
| CN | 1759485 A | 4/2006 |
| JP | 2001-318155 A | 11/2001 |
| JP | 2004-057507 A | 2/2004 |
| JP | 2004-165602 | 6/2004 |
| JP | 2004-273833 A | 9/2004 |
| JP | 2005-533587 A | 11/2005 |
| JP | 2009-139373 A | 6/2009 |

OTHER PUBLICATIONS

U.S. Office Action dated Sep. 22, 2017 that issued in U.S. Appl. No. 14/646,406 including Double Patenting Rejections on pp. 7-10.

* cited by examiner

PHOTODIODE ARRAY

TECHNICAL FIELD

The present invention relates to a photodiode array.

BACKGROUND ART

For example, Patent Literature 1 discloses a photodiode array used in a CT (Computed Tomography) apparatus or the like. In the photodiode array of Patent Literature 1, P$^+$-type semiconductor regions constituting a light detection region are arrayed two-dimensionally on the incident surface side of an n-type semiconductor substrate. An electrode is connected to each of the P$^+$-type semiconductor regions. Each of the electrodes is extracted to the rear surface side on the opposite side to the incident surface through a through-hole provided corresponding to each of the P$^+$-type semiconductor regions. The P$^+$-type semiconductor region and the through-hole are alternately disposed in the semiconductor substrate along a predetermined direction.

CITATION LIST

Patent Literature

[Patent Literature 1] Japanese Unexamined Patent Application Publication (Translation of PCT Application) No. 2005-533587

SUMMARY OF INVENTION

Technical Problem

In the photodiode array of Patent Literature 1, a sufficient distance for providing the through-hole is required between the adjacent P$^+$-type semiconductor regions. For this reason, there may be a concern of an aperture ratio being reduced. In addition, in the photodiode array, an improvement in a variety of reliability such as an improvement in electrical characteristics is required.

An object of the present invention is to provide a photodiode array which is capable of improving an aperture ratio and reliability.

Solution to Problem

According to an aspect of the present invention, there is provided a photodiode array including a plurality of photodiodes formed in a semiconductor substrate, wherein each of the photodiodes includes a first semiconductor region of a first conductivity type, and provided in the semiconductor substrate, a second semiconductor region of the first conductivity type, provided with respect to the first semiconductor region on one surface side of the semiconductor substrate, and having an impurity concentration higher than an impurity concentration of the first semiconductor region, a third semiconductor region of a second conductivity type, provided with respect to the first semiconductor region on the one surface side so as to surround the second semiconductor region separately from the second semiconductor region, and constituting a light detection region together with the first semiconductor region, and a through-electrode provided within a through-hole passing through the one surface and the other surface of the semiconductor substrate so as to pass through the first semiconductor region and the second semiconductor region, and electrically connected to the third semiconductor region.

In the photodiode array, in each of the photodiodes, the through-hole passes through the first and second semiconductor regions, and the second semiconductor region is surrounded by the third semiconductor region. The third semiconductor region constitutes the light detection region together with the first semiconductor region. Here, in each photodiode which is one pixel, the through-hole is surrounded by the light detection region. Therefore, it is possible to reduce a distance between the adjacent photodiodes. Thus, it is possible to improve an aperture ratio. Further, the second semiconductor region through which the through-hole passes has an impurity concentration higher than the impurity concentration of the first semiconductor region. Therefore, a surface leakage current generated in the inner wall of the through-hole and directed toward the light detection region can be reduced by the second semiconductor region. Thus, it is possible to improve electrical characteristics. Additionally, since the second semiconductor region through which the through-hole passes has an impurity concentration higher than the impurity concentration of the first semiconductor region, it is possible to alleviate a variety of stress occurring in the through-hole. Thus, it is possible to improve the strength thereof. Furthermore, the second semiconductor region and the third semiconductor region are separated from each other. Therefore, it is possible to suppress shorting between the second semiconductor region and the third semiconductor region, and to improve electrical characteristics.

A portion of the first semiconductor region may be present between the second semiconductor region and the third semiconductor region so as to surround the second semiconductor region. According to such a configuration, it is possible to improve electrical characteristics.

A distance between an inner edge and an outer edge of the second semiconductor region may be larger than a distance between the outer edge of the second semiconductor region and an inner edge of the third semiconductor region. According to such a configuration, a variety of stress occurring in the through-hole can be much more alleviated by the second semiconductor region.

The inner edge of the third semiconductor region may surround an aperture of the through-hole on the other surface side when viewed from a thickness direction of the semiconductor substrate. According to such a configuration, the third semiconductor region is provided in an area located further outside than the through-hole when viewed from the thickness direction of the semiconductor substrate. Therefore, for example, when a bump electrode is formed within the through-hole, or the like, it is possible to reduce stress applied to the third semiconductor region constituting the light detection region.

Each of the photodiodes may include a contact electrode formed on the one surface and electrically connecting the third semiconductor region and the through-electrode, and an outer edge of the contact electrode may surround the aperture of the through-hole on the other surface side when viewed from the thickness direction of the semiconductor substrate. According to such a configuration, the contact electrode is provided over the range of the inner side and the outer side of the through-hole when viewed from the thickness direction of the semiconductor substrate. Therefore, it is possible to improve strength in the vicinity of the through-hole.

The aperture of the through-hole on the one surface side may exhibit a circular shape. According to such a configuration, for example, when the bump electrode is formed within the through-hole, or the like, it is possible to suppress the occurrence of stress concentration in the through-hole.

Advantageous Effects of Invention

According to the present invention, it is possible to provide a photodiode array which is capable of improving an aperture ratio and reliability.

DESCRIPTION OF EMBODIMENTS

Figure 1:
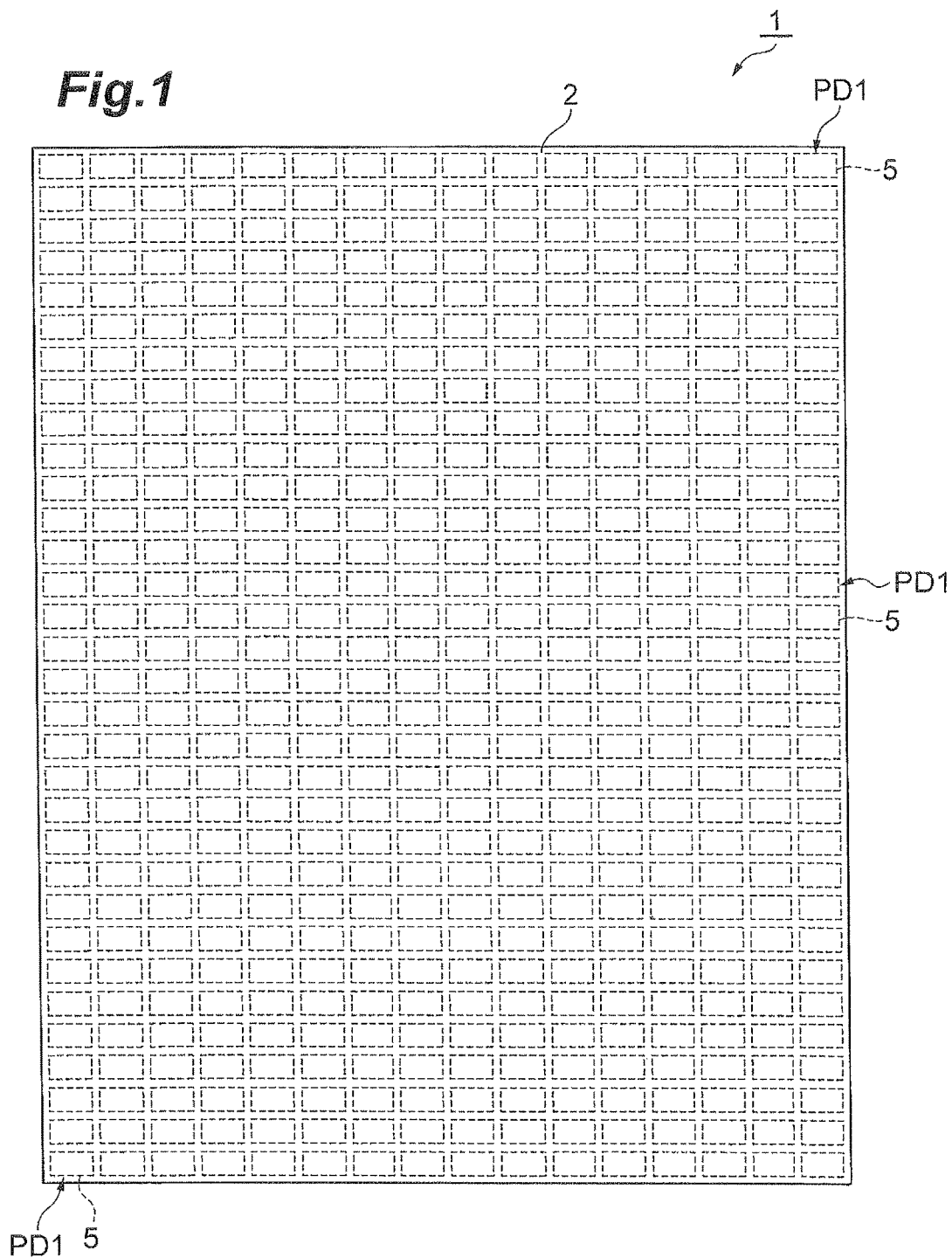
FIG. 1 is a plan view illustrating a photodiode array according to an embodiment of the present invention.

Hereinafter, a photodiode array according to an embodiment will be described in detail with reference to the accompanying drawings. Meanwhile, the same or equivalent components are denoted by the same reference numerals and signs, and thus the description thereof will not be repeated.

[Photodiode Array]

As shown in FIG. 1, a photodiode array 1 is used in, for example, a CT apparatus or the like. The photodiode array 1 includes a plurality of photodiodes PD1 formed in a semiconductor substrate 2.

Figure 3:
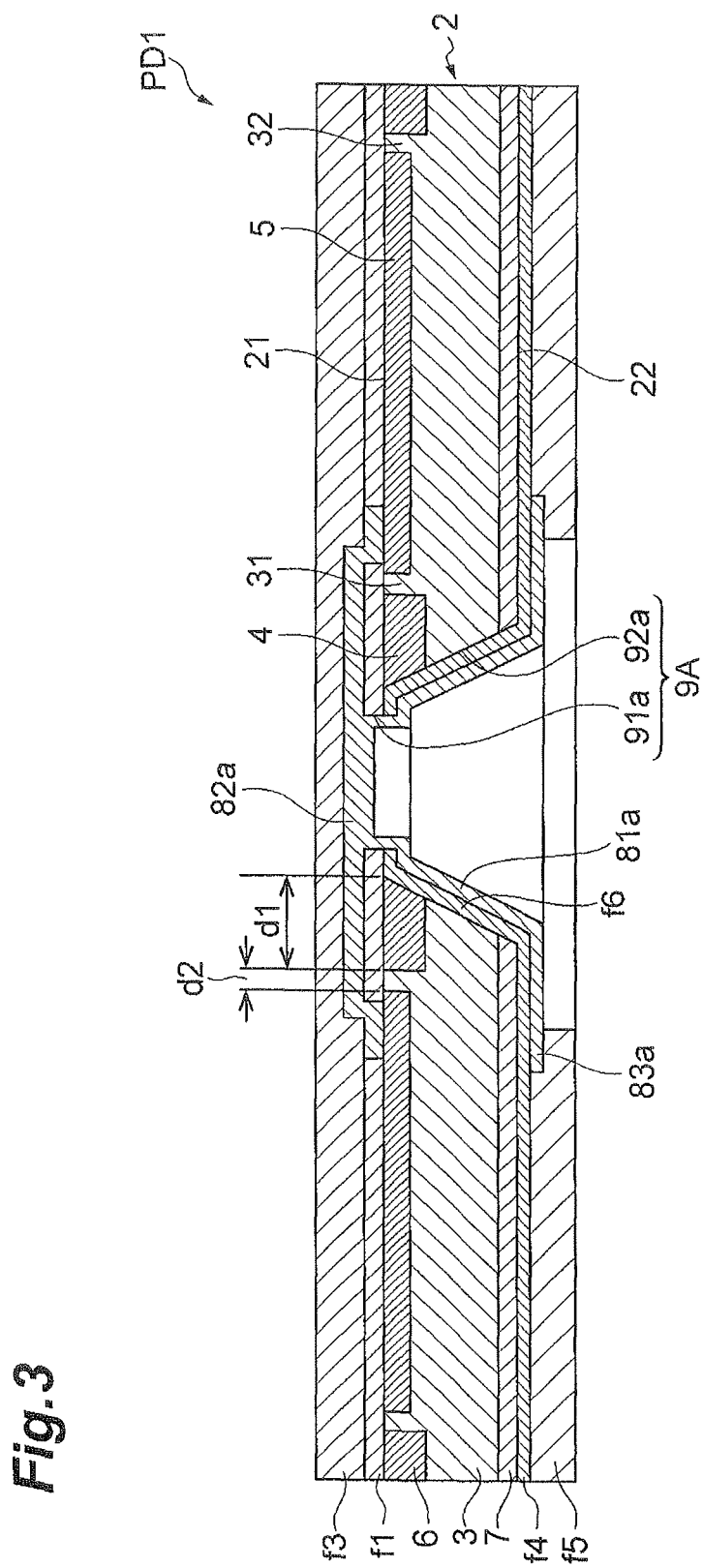
FIG. 3 is a cross-sectional view taken along line III-III of FIG. 2.

The semiconductor substrate 2 exhibits a rectangular shape when seen in plan view. As shown in FIG. 3, the semiconductor substrate 2 has a surface (one surface) 21 and a rear surface (the other surface) 22 which face each other. An insulating film f1 and an insulating film f3 are formed on the surface 21 in this order from the surface 21. An insulating film f4 and an insulating film f5 are formed on the rear surface 22 in this order from the rear surface 22. As each insulating film, a $SiO_2$ film, a SiN film or the like is formed.

As shown in FIG. 1, photodiodes PD1 are arrayed two-dimensionally in the semiconductor substrate 2. Each of the photodiodes PD1 functions as one pixel. As shown in FIG. 3, the photodiode PD1 includes a first semiconductor region 3, a second semiconductor region 4, a third semiconductor region 5, a fourth semiconductor region 6, a fifth semiconductor region 7, a through-electrode 81a, a contact electrode 82a, and a terminal electrode 83a.

The first semiconductor region 3 includes a central portion in the thickness direction of the semiconductor substrate 2. The first semiconductor region 3 exhibits a rectangular shape when viewed from the thickness direction of the semiconductor substrate 2. The first semiconductor region 3 is provided throughout the entire photodiode PD1 in the central portion in the thickness direction of the semiconductor substrate 2. The first semiconductor regions 3 and 3 of the adjacent photodiodes PD1 and PD1 are formed integrally. The first semiconductor region 3 is an n$^-$-type semiconductor region. The first semiconductor region 3 is formed of, for example, Si or the like. A substrate electrode, not shown, is connected to the first semiconductor region 3.

The second semiconductor region 4 is provided with respect to the first semiconductor region 3 on the surface 21 side of the semiconductor substrate 2. The second semiconductor region 4 exhibits an annular shape such that the outer edge thereof exhibits a circular shape and the inner edge thereof exhibits a rectangular shape (specifically, square shape) when viewed from the thickness direction of the semiconductor substrate 2. The second semiconductor region 4 may exhibit other annular shapes (for example, polygonal annular shape such as a quadrangular annular shape, circular annular shape, and the like). That is, the annular shape refers to a unitary shape in which any region is surrounded so as to be closed. The inner edge of the second semiconductor region 4 forms an aperture of a through-hole 9A (described later) on the surface 21 side. The second semiconductor region 4 is an n$^+$-type semiconductor region, and has an impurity concentration higher than the impurity concentration of the first semiconductor region 3. The second semiconductor region 4 is formed, for example, by diffusing an n-type impurity into Si, or the like.

The third semiconductor region 5 is provided with respect to the first semiconductor region 3 on the surface 21 side of the semiconductor substrate 2. The third semiconductor region 5 is separated from the second semiconductor region 4, and surrounds the second semiconductor region 4. The third semiconductor region 5 exhibits an annular shape such that the outer edge thereof exhibits a rectangular shape and the inner edge thereof exhibits a circular shape when viewed from the thickness direction of the semiconductor substrate 2. The third semiconductor region 5 may exhibit other annular shapes. The third semiconductor region 5 is a p$^+$-type semiconductor region. The third semiconductor region 5 and the first semiconductor region 3 form a pn junction, and constitute a light detection region of the photodiode PD1. The third semiconductor region 5 is formed, for example, by diffusing a p-type impurity into Si, or the like. The second semiconductor region 4 is formed to be deeper than the third semiconductor region 5.

A first portion 31 that is a portion of the first semiconductor region 3 is present between the second semiconductor region 4 and the third semiconductor region 5. When viewed from the thickness direction of the semiconductor substrate 2, the first portion 31 surrounds the second semiconductor region 4, and is surrounded by the third semiconductor region 5. The first portion 31 exhibits a circular annular shape when viewed from the thickness direction of the semiconductor substrate 2. The first portion 31 may exhibit other annular shapes.

The fourth semiconductor region 6 is provided with respect to the first semiconductor region 3 on the surface 21 side of the semiconductor substrate 2. When viewed from the thickness direction of the semiconductor substrate 2, the fourth semiconductor region 6 exhibits a rectangular annular shape larger than the third semiconductor region 5, and surrounds the third semiconductor region 5. The fourth semiconductor region 6 may exhibit other annular shapes. The fourth semiconductor region 6 is separated from the third semiconductor region 5. A second portion 32 that is a portion of the first semiconductor region 3 is present between the third semiconductor region 5 and the fourth semiconductor region 6. The second portion 32 exhibits a rectangular annular shape when viewed from the thickness direction of the semiconductor substrate 2. The second portion 32 may exhibit other annular shapes. The fourth semiconductor regions 6 and 6 of the adjacent photodiodes PD1 and PD1 are formed integrally.

The fourth semiconductor region 6 is an n$^+$-type semiconductor region, and has an impurity concentration higher than the impurity concentration of the first semiconductor region 3. The fourth semiconductor region 6 is formed, for example, by diffusing an n-type impurity into Si. The fourth semiconductor region 6 functions as a channel stopper that separates the adjacent photodiodes PD1 and PD1 from each other. The fourth semiconductor region 6 is grounded through an electrode which is not shown.

The fifth semiconductor region 7 is provided with respect to the first semiconductor region 3 on the rear surface 22 side of the semiconductor substrate 2. The fifth semiconductor region 7 is formed throughout the entire photodiode PD1 on the rear surface 22 side. The fifth semiconductor regions 7 and 7 of the adjacent photodiodes PD1 and PD1 are formed integrally. The fifth semiconductor region 7 is an n$^+$-type semiconductor region, and has an impurity concentration higher than the impurity concentration of the first semiconductor region 3. The fifth semiconductor region 7 is formed, for example, by diffusing an n-type impurity into Si. The first semiconductor region 3 and the fifth semiconductor region 7 may be formed, for example, by growing an n$^-$-type epitaxial layer on n$^+$-type Si, wherein the epitaxial layer has an impurity concentration lower than that of the Si.

The through-hole 9A passing through the surface 21 and the rear surface 22 is provided in the semiconductor substrate 2. The through-hole 9A passes through the first semiconductor region 3, the second semiconductor region 4 and the fifth semiconductor region 7. The through-hole 9A includes a portion expanded from the surface 21 side toward the rear surface 22 side. The through-hole 9A includes a small hole portion 91a located on the surface 21 side and a large hole portion 92a located on the rear surface 22 side.

The small hole portion 91a passes through the insulating film f1. The small hole portion 91a exhibits a cylindrical shape. The aperture of the through-hole 9A on the surface 21 side exhibits a circular shape.

The large hole portion 92a passes through the first semiconductor region 3 and the second semiconductor region 4. The large hole portion 92a is expanded from the surface 21 side toward the rear surface 22 side, and exhibits a tapered shape. Specifically, the large hole portion 92a exhibits a quadrangular frustum shape. The aperture of the through-hole 9A on the rear surface 22 side exhibits a rectangular shape (specifically, square shape). The inner wall of the large hole portion 92a and the surface 21 form an angle of approximately 55°. The inner wall of the large hole portion 92a and the rear surface 22 form an angle of approximately 125°. The upper side of the large hole portion 92a is larger than the diameter of the small hole portion 91a. The small hole portion 91a and the large hole portion 92a are disposed coaxially with each other.

An insulating film f6 is formed on the inner wall of the large hole portion 92a. The insulating film f6 is formed continuously with the insulating film f4 on the rear surface 22 side. As the insulating film f6, a SiO$_2$ film, a SiN film or the like is formed.

A distance d1 between the inner edge and the outer edge of the second semiconductor region 4 is larger than a distance d2 between the outer edge of the second semiconductor region 4 and the inner edge of the third semiconductor region 5 (distance between the inner edge and the outer edge of the first portion 31).

The inner edge of the third semiconductor region 5 surrounds the aperture of the through-hole 9A on the rear surface 22 side when viewed from the thickness direction of the semiconductor substrate 2. That is, the third semiconductor region 5 is provided in an area located further outside than the through-hole 9A when viewed from the thickness direction of the semiconductor substrate 2.

The thickness/impurity concentration of each region are, for example, as follows.

First semiconductor region 3: thickness of 50 to 625 μm/impurity concentration of $5 \times 10^{11}$ to $5 \times 10^{15}$ cm$^{-3}$ Second semiconductor region 4: thickness of 1.0 to 10 μm/impurity concentration of $1 \times 10^{18}$ to $1 \times 10^{20}$ cm$^{-3}$ Third semiconductor region 5: thickness of 0.01 to 3.0 μm/impurity concentration of $1 \times 10^{18}$ to $1 \times 10^{20}$ cm$^{-3}$ Fourth semiconductor region 6: thickness of 1.0 to 10 μm/impurity concentration of $1 \times 10^{18}$ to $1 \times 10^{20}$ cm$^{-3}$ Fifth semiconductor region 7: thickness of 1.0 to 620 μm/impurity concentration of $1 \times 10^{18}$ to $1 \times 10^{20}$ cm$^{-3}$ The through-electrode 81a is provided within the through-hole 9A. The through-electrode 81a exhibits a hollow quadrangular frustum shape in which the bottom is completely opened. The through-electrode 81a is formed on the inner wall of the small hole portion 91a and on the insulating film f6 within the large hole portion 92a. The through-electrode 81a blocks the aperture of the through-hole 9A on the surface 21 side.

The contact electrode 82a is formed on the surface 21. The contact electrode 82a electrically connects the third semiconductor region 5 and the through-electrode 81a. The contact electrode 82a includes a disk-shaped portion and a circular annular portion. The disk-shaped portion is formed on the insulating film f1. The disk-shaped portion covers the aperture of the through-hole 9A on the surface 21 side. The disk-shaped portion is coupled to the through-electrode 81a. The circular annular portion is expanded from the outer edge at one surface of the disk-shaped portion (surface on the insulating film f1 side) toward the radial outer side. The circular annular portion passes through the insulating film f1, and comes into contact with the third semiconductor region 5.

The outer edge of the contact electrode 82a surrounds the aperture of the through-hole 9A on the rear surface 22 side when viewed from the thickness direction of the semiconductor substrate 2. That is, the contact electrode 82a is provided over the range of the inner side and the outer side of the through-hole 9A when viewed from the thickness direction of the semiconductor substrate 2.

The terminal electrode 83a is formed on the rear surface 22. The terminal electrode 83a is formed on the insulating film f4. The terminal electrode 83a exhibits an annular shape such that the outer edge thereof exhibits a circular shape and the inner edge thereof exhibits a quadrangular shape. The inner edge of the terminal electrode 83a is coupled to the through-electrode 81a. The contact electrode 82a, the through-electrode 81a and the terminal electrode 83a are formed of, for example, aluminum or the like.

[Method of Manufacturing Photodiode Array]

Next, an example of a method of manufacturing the photodiode array 1 will be described.

Figure 4:
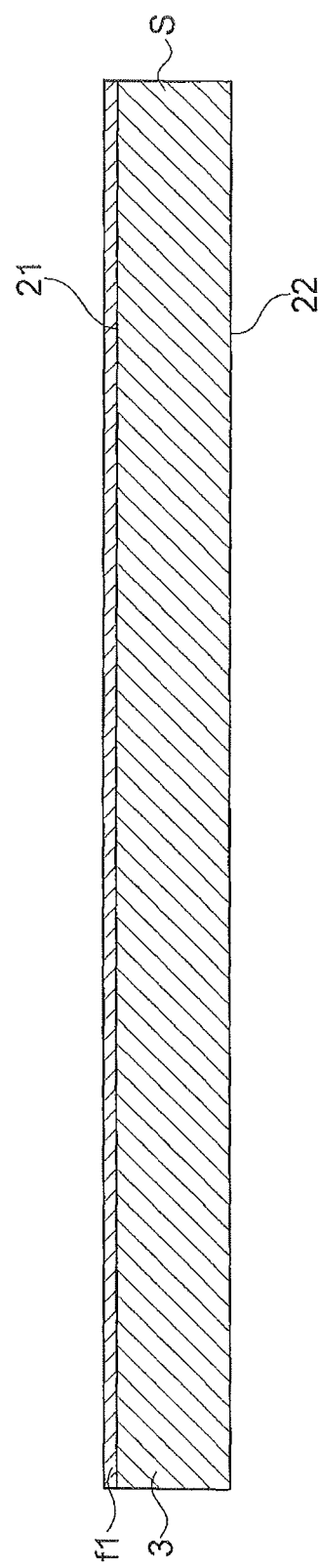
FIG. 4 is a cross-sectional view illustrating a process of a method of manufacturing the photodiode array of FIG. 1.

As shown in FIG. 4, first, a substrate S of n⁻-type Si with a crystal plane (100) is prepared. The first semiconductor region 3 is included in the substrate S. Subsequently, the insulating film f1 is formed on the surface 21 by, for example, thermal oxidation.

Figure 5:
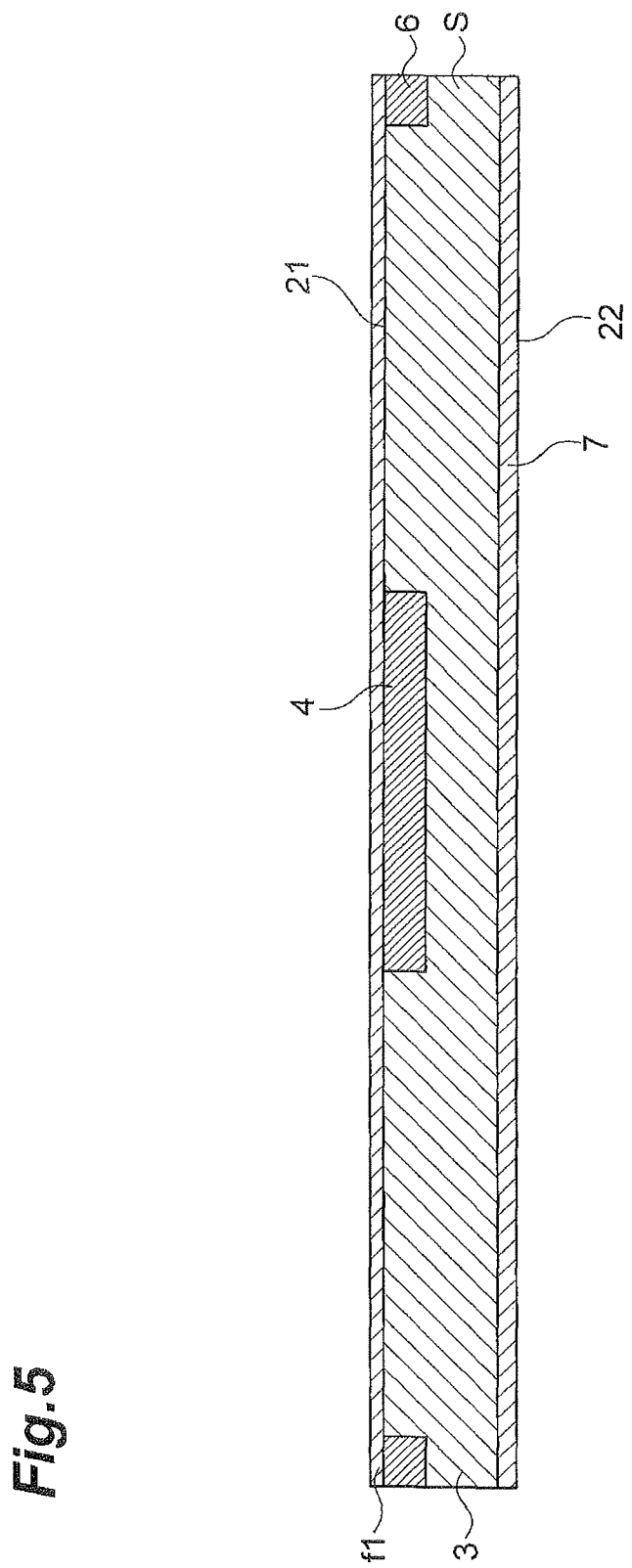
FIG. 5 is a cross-sectional view illustrating a process of a method of manufacturing the photodiode array of FIG. 1.

As shown in FIG. 5, subsequently, the insulating film f1, at positions where the second semiconductor region 4 and the fourth semiconductor region 6 are going to be formed, is removed by photo-etching, and an aperture is formed. Phosphorus is thermally diffused into the substrate S through the aperture. In this case, phosphorus is also thermally diffused into the rear surface 22. Thereby, the second semiconductor region 4, the fourth semiconductor region 6 and the fifth semiconductor region 7 are formed. Subsequently, the aperture is closed by thermal oxidation.

Figure 6:
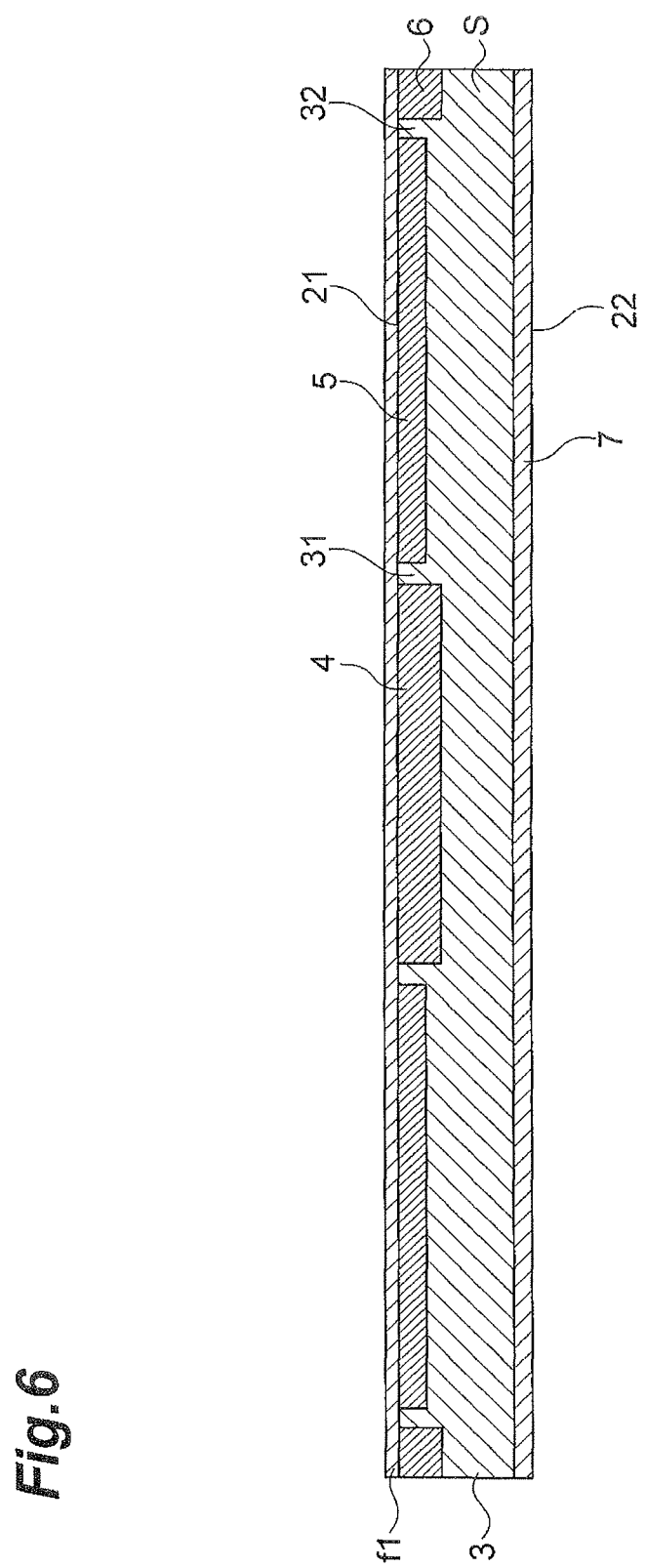
FIG. 6 is a cross-sectional view illustrating a process of a method of manufacturing the photodiode array of FIG. 1.

As shown in FIG. 6, subsequently, the insulating film f1, at a position where the third semiconductor region 5 is going to be formed, is removed by photo-etching, and an aperture is formed. Boron is thermally diffused into the substrate S through the aperture. Thereby, the third semiconductor region 5 is formed. Subsequently, the aperture is closed by thermal oxidation.

Figure 7:
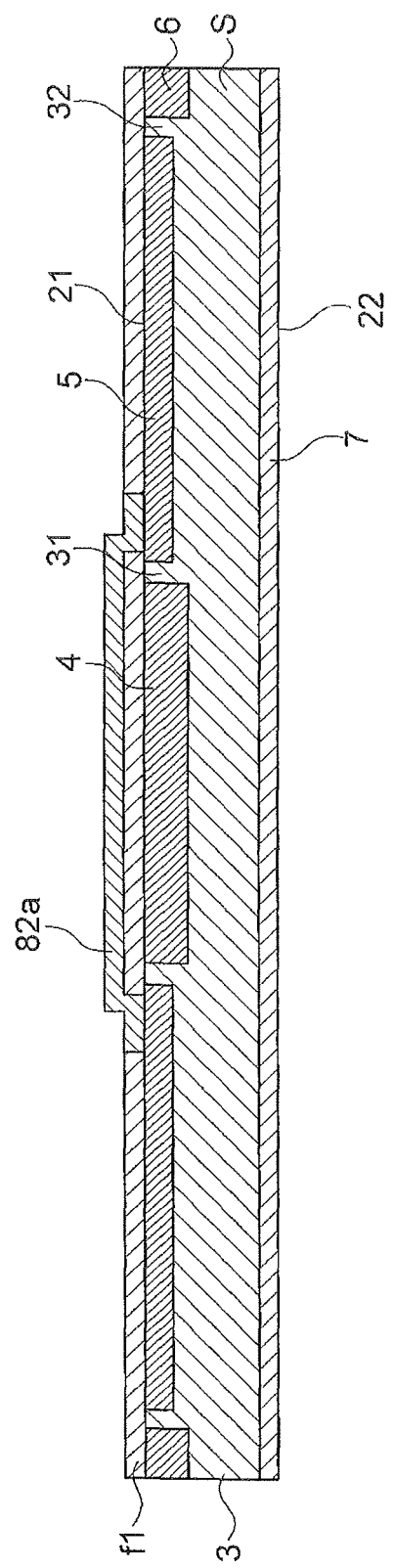
FIG. 7 is a cross-sectional view illustrating a process of a method of manufacturing the photodiode array of FIG. 1.

As shown in FIG. 7, subsequently, the insulating film f1, at a position where the circular annular portion of the contact electrode 82a is going to be formed, is removed by photo-etching, and an aperture (contact hole) is formed. Subsequently, the contact electrode 82a is formed by sputtering.

Figure 8:
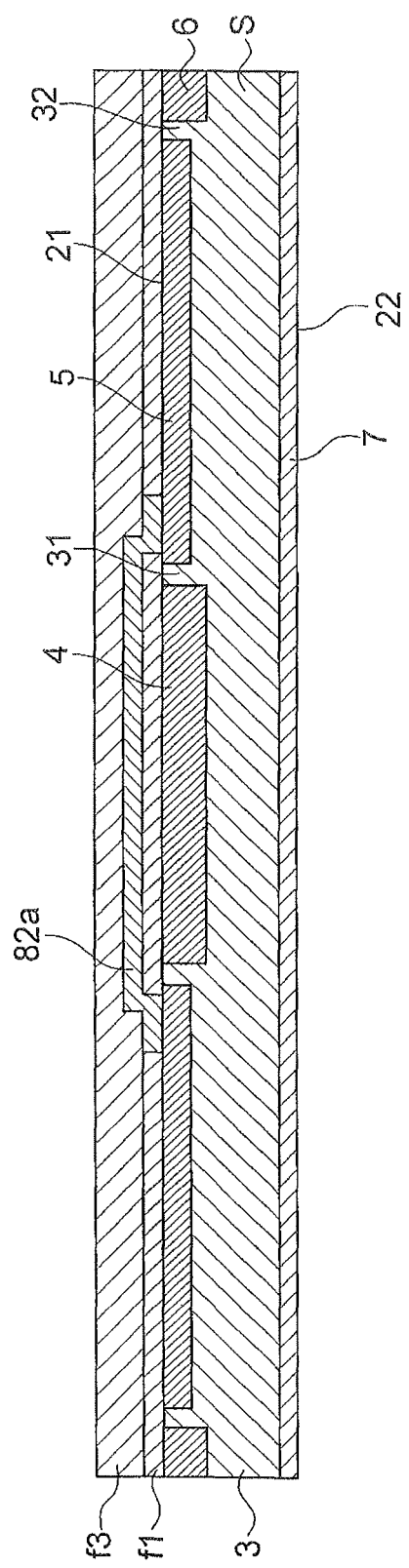
FIG. 8 is a cross-sectional view illustrating a process of a method of manufacturing the photodiode array of FIG. 1.

As shown in FIG. 8, subsequently, the insulating film 13 is formed on the insulating film f1 and the contact electrode 82a by, for example, plasma CVD, LP-CVD or the like. Subsequently, chemical mechanical polishing (CMP) is performed on the surface 21 side (specifically, insulating film 13) in order to adjust the thickness of a portion through which light passes.

Figure 9:
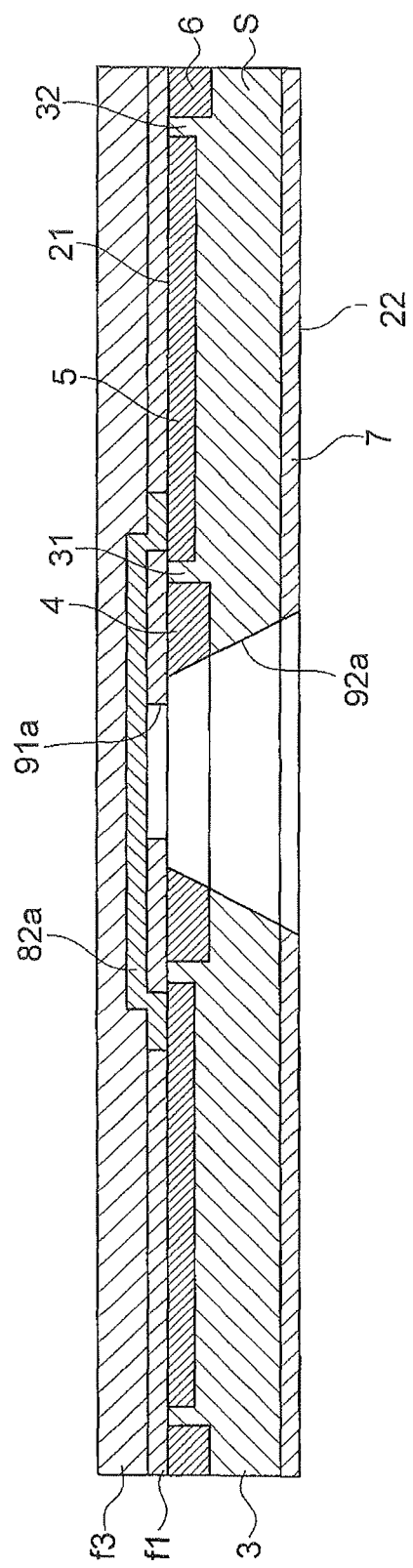
FIG. 9 is a cross-sectional view illustrating a process of a method of manufacturing the photodiode array of FIG. 1.

As shown in FIG. 9, subsequently, anisotropic etching is performed on the rear surface 22 by alkaline etching (using a potassium hydroxide solution, TMAH, hydrazine, EDP, or the like). Thereby, the large hole portion 92a in which the inner wall thereof and the surface 21 form an angle of approximately 55° is formed. The anisotropic etching is performed until the large hole portion 92a reaches the insulating film f1. Subsequently, the small hole portion 91a is formed by dry etching.

Figure 10:
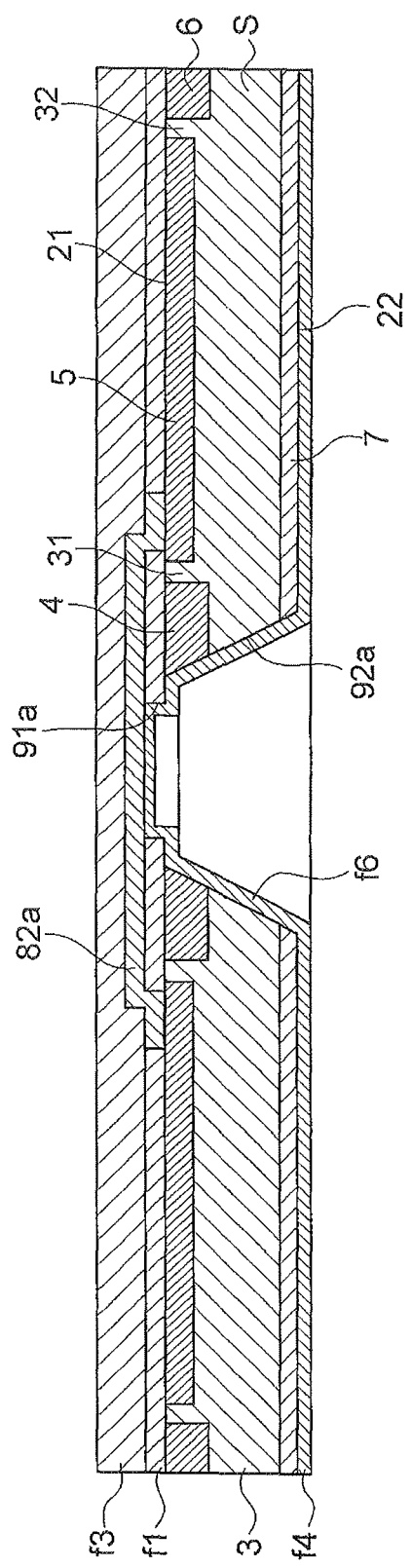
FIG. 10 is a cross-sectional view illustrating a process of a method of manufacturing the photodiode array of FIG. 1.

As shown in FIG. 10, subsequently, the insulating films f4 and f6 are formed on the rear surface 22, the inner wall of the large hole portion 92a, and the inner wall of the small hole portion 91a by, for example, plasma CVD, LP-CVD or the like.

Figure 11:
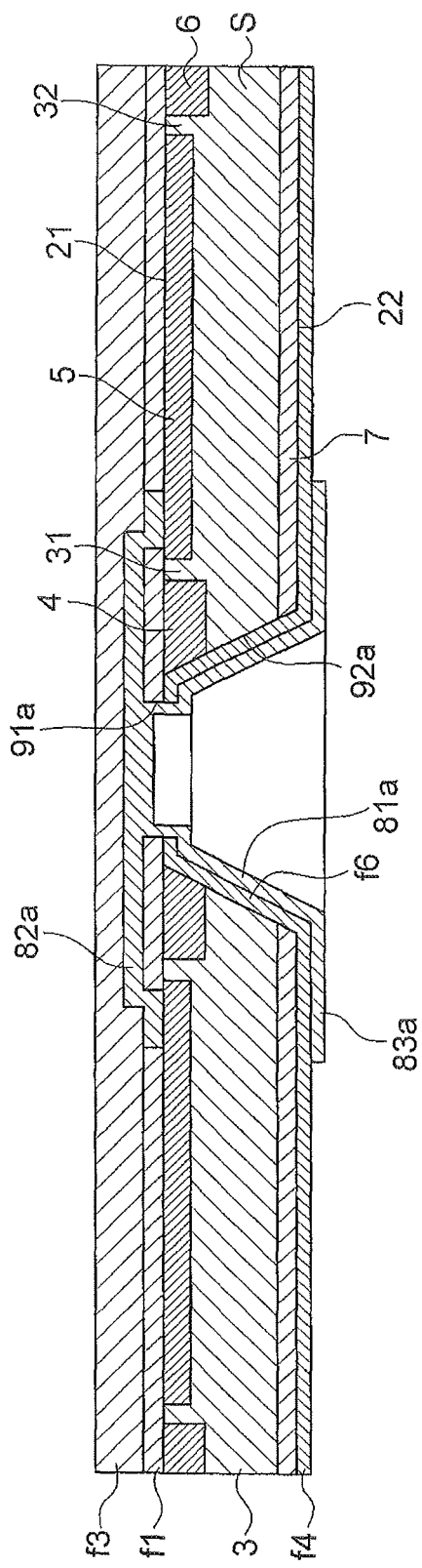
FIG. 11 is a cross-sectional view illustrating a process of a method of manufacturing the photodiode array of FIG. 1.

As shown in FIG. 11, subsequently, the insulating film f6 on the inner wall of the small hole portion 91a is removed by photo-etching to thereby form an aperture (contact hole), and a portion of the contact electrode 82a is exposed to the rear surface 22 side. Subsequently, the through-electrode 81a and the terminal electrode 83a are formed by sputtering.

Figure 12:
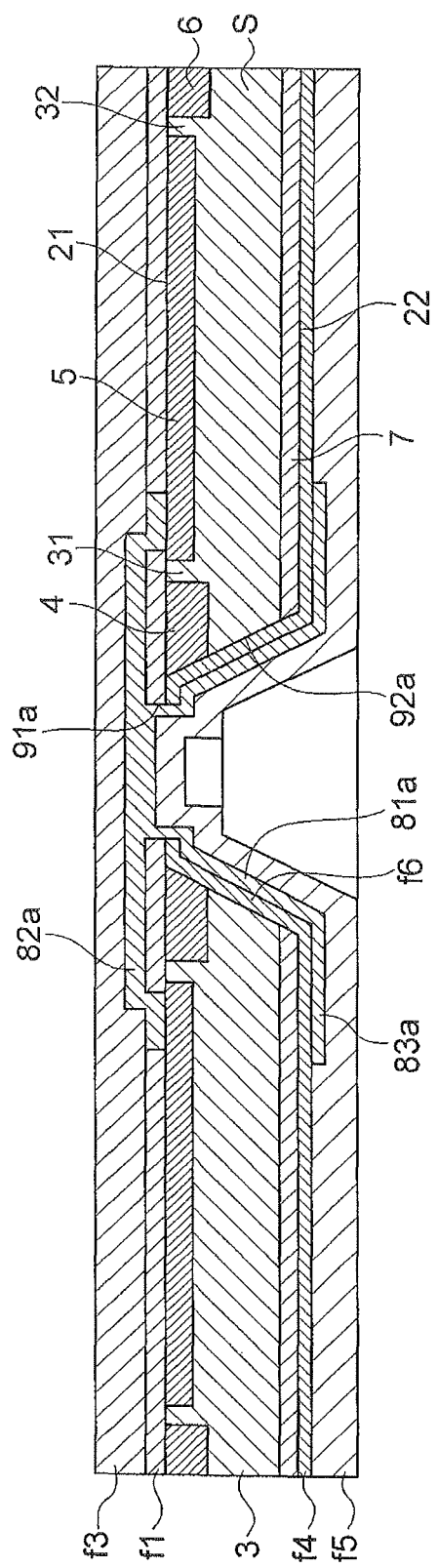
FIG. 12 is a cross-sectional view illustrating a process of a method of manufacturing the photodiode array of FIG. 1.

As shown in FIG. 12, subsequently, the insulating film f5 is formed on the insulating film f4, the terminal electrode 83a and the through-electrode 81a by, for example, plasma CVD, LP-CVD or the like. Subsequently, the insulating film f5 on the inner edge side of the terminal electrode 83a and the through-electrode 81a is removed by photo-etching. As described above, the configuration shown in FIG. 3 is obtained.

[CT Apparatus]

Figure 13:
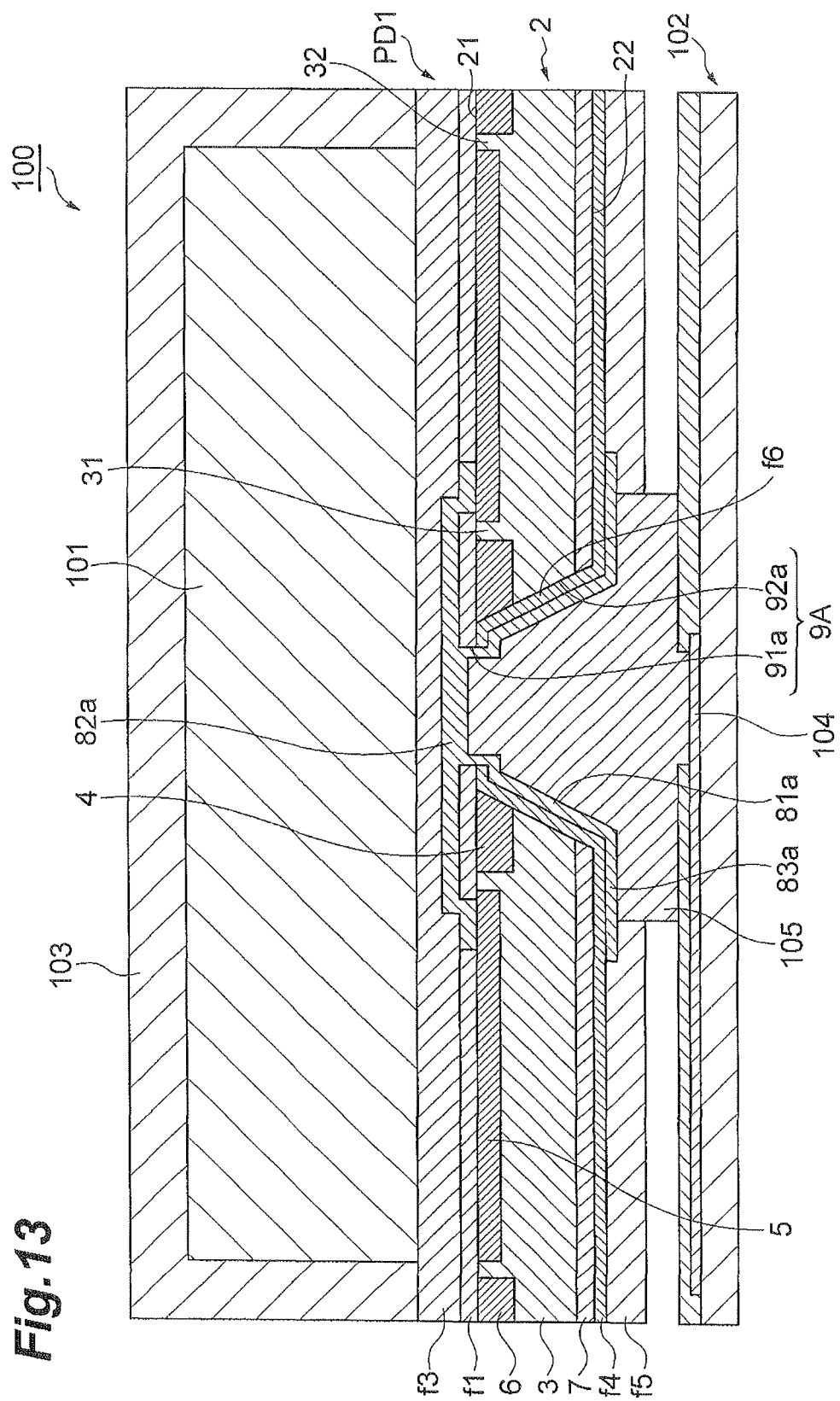
FIG. 13 is a cross-sectional view illustrating a portion of a CT apparatus to which the photodiode array of FIG. 1 is applied.

As shown in FIG. 13, a CT apparatus 100 includes the aforementioned photodiode array 1, a scintillator 101, and a mounting substrate 102.

The scintillator 101 comes into contact with the insulating film f3. The scintillator 101 exhibits a rectangular parallelepiped shape. When viewed from the thickness direction of the semiconductor substrate 2, the scintillator 101 has approximately the same size as that of the third semiconductor region 5 constituting a light detection region, and overlaps the third semiconductor region 5. The scintillator 101 is a solid-state scintillator such as a crystalline scintillator (crystalline material such as CsI, NaI, LaBr3, or GAGG), a ceramic scintillator (such as sintered body of inorganic phosphor), or a plastic scintillator (such as PET). A reflective film 103 is provided on surfaces other than the contact surface with the insulating film f3 in the scintillator 101. The reflective film 103 is formed of, for example, aluminum, titanium oxide or the like.

The mounting substrate 102 has an electrode 104. The electrode 104 is electrically connected to the through-electrode 81a through a bump electrode 105 formed within the through-electrode 81a. The bump electrode 105 is formed of a conductive material such as, for example, solder, gold, nickel, copper, or a conductive adhesive resin.

In the CT apparatus 100, when X-rays are incident on the scintillator 101, the scintillator 101 emits scintillation light. The scintillation light is directly incident on the third semiconductor region 5, or is incident on the third semiconductor region 5 after being reflected by the contact electrode 82a, the reflective film 103 and the like. Information of charge generated in the light detection region by the incidence of the scintillation light is input to the mounting substrate 102 through the contact electrode 82a, the through-electrode 81a, the terminal electrode 83a and the bump electrode 105.

In the photodiode array 1 of the present embodiment described above, in each of the photodiodes PD1, the through-hole 9A passes through the first semiconductor region 3 and the second semiconductor region 4, and the second semiconductor region 4 is surrounded by the third semiconductor region 5. The third semiconductor region 5 constitutes the light detection region together with the first semiconductor region 3. Here, in each photodiode PD1 which is one pixel, the through-hole 9A is surrounded by the light detection region. Thereby, a distance between the adjacent photodiodes PD1 and PD1 is reduced. Thus, it is possible to improve an aperture ratio.

The second semiconductor region 4 through which the through-hole 9A passes has an impurity concentration higher than the impurity concentration of the first semiconductor region 3. Therefore, a surface leakage current generated in the inner wall of the through-hole 9A and directed toward the light detection region can be reduced by the second semiconductor region 4. In addition, damage caused by etching can be reduced by the second semiconductor region 4. Thus, it is possible improve electrical characteristics. These effects are exhibited more appropriately by the second semiconductor region 4 being formed to be deeper than the third semiconductor region 5.

Since the materials of the insulating film f6 and the semiconductor substrate 2 are different from each other, it is considered that stress occurs in the interface between the insulating film f6 and the through-hole 9A. In the photodiode array 1, since the second semiconductor region 4 through which the through-hole 9A passes has an impurity concentration higher than the impurity concentration of the first semiconductor region 3, the stress occurring in the interface between the through-hole 9A and the insulating film f6 can be alleviated by the second semiconductor region 4. Thus, it is possible to improve the strength thereof.

Since the semiconductor substrate 2 has the surface 21 and the rear surface 22 with large areas as compared with its thickness, it is considered that distortion occurs in the semiconductor substrate 2. In the photodiode array 1, the stress occurring in the through-hole 9A due to the distortion of the semiconductor substrate 2 can be alleviated by the second semiconductor region 4 through which the through-hole 9A passes. Thus, it is possible to improve the strength thereof.

When the bump electrode 105 is formed within the through-hole 9A, it is considered that stress occurs in the through-hole 9A due to the thermal contraction of the bump electrode 105, or the like. In the photodiode array 1, stress occurring during the formation of the bump electrode 105, or the like can be alleviated by the second semiconductor region 4 through which the through-hole 9A passes. Thus, it is possible to improve the strength thereof.

The second semiconductor region 4 and the third semiconductor region 5 are separated from each other. The first portion 31 that is a portion of the first semiconductor region 3 is present between the second semiconductor region 4 and the third semiconductor region 5 so as to surround the second semiconductor region 4. Therefore, it is possible to suppress shorting between the second semiconductor region 4 and the third semiconductor region 5. Thus, it is possible to improve electrical characteristics.

The distance d1 between the inner edge and the outer edge of the second semiconductor region 4 is larger than the distance d2 between the outer edge of the second semiconductor region 4 and the inner edge of the third semiconductor region 5. Therefore, a variety of stress described above occurring in the through-hole 9A can be much more alleviated by the second semiconductor region 4.

The inner edge of the third semiconductor region 5 surrounds the aperture of the through-hole 9A on the rear surface 22 side when viewed from the thickness direction of the semiconductor substrate 2. That is, the third semiconductor region 5 is provided in an area located further outside than the through-hole 9A when viewed from the thickness direction of the semiconductor substrate 2. Therefore, when the bump electrode 105 is formed within the through-hole 9A, or the like, it is possible to reduce stress applied to the third semiconductor region 5 constituting the light detection region.

Each of the photodiodes PD1 includes the contact electrode 82a formed on the surface 21 and connecting the third semiconductor region 5 and the through-electrode 81a, and the outer edge of the contact electrode 82a surrounds the aperture of the through-hole 9A on the rear surface 22 side when viewed from the thickness direction of the semiconductor substrate 2. That is, when viewed from the thickness direction of the semiconductor substrate 2, the contact electrode 82a is provided over the range of the inner side and the outer side of the through-hole 9A. Therefore, it is possible to improve strength in the vicinity of the through-hole 9A.

The aperture of the through-hole 9A on the surface 21 side exhibits a circular shape. Therefore, for example, when the bump electrode 105 is formed within the through-hole 9A, or the like, it is possible to suppress the occurrence of stress concentration in the through-hole 9A.

When the through-hole is surrounded by the light detection region, a leakage current generated due to damage to the inner wall of the through-hole has a tendency to go into the light detection region. Therefore, when the through-hole is surrounded by the light detection region, it is preferable to reduce damage to the inner wall of the through-hole. In the photodiode array 1, the through-hole 9A includes the large hole portion 92a having a tapered shape which is expanded from the surface 21 toward the rear surface 22. The large hole portion 92a is formed by anisotropic etching. In the anisotropic etching, damage is not likely to occur in the inner wall of the through-hole 9A. Therefore, in the photodiode array 1, it is possible to reduce a leakage current from the through-hole 9A. Therefore, it is possible to improve electrical characteristics.

The inner wall of the large hole portion 92a and the rear surface 22 form an obtuse angle (approximately 125°). Therefore, when the insulating films f4 and f6 are formed, the insulating films f4 and f6 at the aperture edge of the through-hole 9A on the rear surface 22 side have a tendency to be formed thicker as compared with a case where the inner wall of the large hole portion 92a and the rear surface 22 form a right angle or an acute angle. Therefore, it is possible to improve electrical characteristics.

The outer edge of the second semiconductor region 4 exhibits a circular shape. Therefore, it is possible to suppress the concentration of an electric field as compared with a case where the outer edge of the second semiconductor region 4 exhibits a polygonal shape or the like.

Next, a photodiode array of another embodiment will be described.

Figure 14:
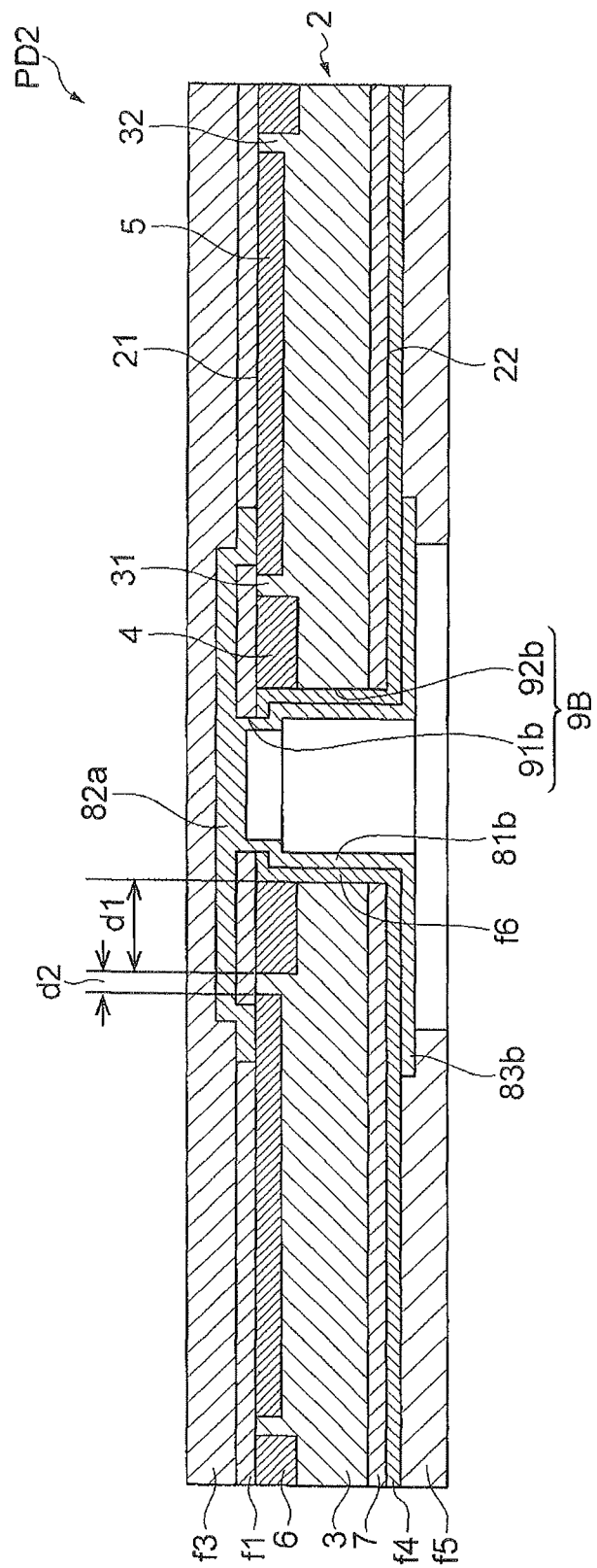
FIG. 14 is a cross-sectional view illustrating a photodiode of a photodiode array according to another embodiment of the present invention.

As shown in FIG. 14, the photodiode array of the present embodiment includes a photodiode PD2 in place of the aforementioned photodiode PD1 (see FIG. 3). The photodiode PD2 differs from the photodiode PD1, in that the shapes of a through-hole, a through-electrode and a terminal electrode in the photodiode PD2 are different from those in the photodiode PD1.

A through-hole 9B includes a small hole portion 91b located on the surface 21 side and a large hole portion 92b located on the rear surface 22 side. The small hole portion 91b has the same configuration as that of the aforementioned small hole portion 91a.

The large hole portion 92b passes through the first semiconductor region 3 and the second semiconductor region 4. The large hole portion 92b exhibits a cylindrical shape having a diameter larger than the diameter of the small hole portion 91b. An aperture of the through-hole 9B on the rear surface 22 side exhibits a circular shape. The small hole portion 91b and the large hole portion 92b are disposed coaxially with each other. The large hole portion 92b can be formed by using dry etching instead of anisotropic etching, for example, in the aforementioned manufacturing method.

The inner edge of the third semiconductor region 5 surrounds the aperture of the through-hole 9B on the rear surface 22 side when viewed from the thickness direction of the semiconductor substrate 2. That is, the third semiconductor region 5 is provided in an area located further outside than the through-hole 9B when viewed from the thickness direction of the semiconductor substrate 2.

The outer edge of the contact electrode 82a surrounds the aperture of the through-hole 9B on the rear surface 22 side when viewed from the thickness direction of the semiconductor substrate 2. That is, the contact electrode 82a is provided over the range of the inner side and the outer side of the through-hole 9B when viewed from the thickness direction of the semiconductor substrate 2.

A through-electrode 81b is provided within the through-hole 9B. The through-electrode 81b exhibits a cylindrical shape in which an end on the surface 21 side is closed. The through-electrode 81b is formed on the inner wall of the small hole portion 91b and the insulating film f6 within the large hole portion 92b. The through-electrode 81b blocks the aperture of the through-hole 9A on the surface 21 side.

A terminal electrode 83b is formed on the rear surface 22. The terminal electrode 83b is formed on the insulating film f4. The terminal electrode 83b exhibits a circular annular shape. The inner edge of the terminal electrode 83b is coupled to the through-electrode 81b.

In the photodiode array including a plurality of photodiodes PD2 described above, in each of the photodiodes PD2, the through-hole 9B passes through the first semiconductor region 3 and the second semiconductor region 4, and the second semiconductor region 4 is surrounded by the third semiconductor region 5. The third semiconductor region 5 constitutes a light detection region together with the first semiconductor region 3. Here, in each photodiode PD2 which is one pixel, the through-hole 9B is surrounded by the light detection region. Thereby, a distance between the adjacent photodiodes PD2 and PD2 is reduced. Thus, it is possible to improve an aperture ratio.

The second semiconductor region 4 through which the through-hole 9B passes has an impurity concentration higher than the impurity concentration of the first semiconductor region 3. Therefore, a surface leakage current generated in the inner wall of the through-hole 9A and directed toward the light detection region can be reduced by the second semiconductor region 4. In addition, damage caused by etching can be reduced by the second semiconductor region 4. Thus, it is possible to improve electrical characteristics. These effects are exhibited more appropriately by the second semiconductor region 4 being formed to be deeper than the third semiconductor region 5.

Since the materials of the insulating film f6 and the semiconductor substrate 2 are different from each other, it is considered that stress occurs in the interface between the insulating film f6 and the through-hole 9B. In the photodiode array 1, since the second semiconductor region 4 through which the through-hole 9B passes has an impurity concentration higher than the impurity concentration of the first semiconductor region 3, the stress occurring in the interface between the through-hole 9B and the insulating film f6 can be alleviated by the second semiconductor region 4. Thus, it is possible to improve the strength thereof.

Since the semiconductor substrate 2 has the surface 21 and the rear surface 22 with large areas as compared with its thickness, it is considered that distortion occurs in the semiconductor substrate 2. In the photodiode array 1, the stress occurring in the through-hole 9B due to the distortion of the semiconductor substrate 2 can be alleviated by the second semiconductor region 4 through which the through-hole 9B passes. Thus, it is possible to improve the strength thereof.

When the bump electrode 105 is formed within the through-hole 9B, it is considered that stress occurs in the through-hole 9B due to the thermal contraction of the bump electrode 105, or the like. In the photodiode array 1, stress occurring during the formation of the bump electrode 105, or the like can be alleviated by the second semiconductor region 4 through which the through-hole 9B passes. Thus, it is possible to improve the strength thereof.

The second semiconductor region 4 and the third semiconductor region 5 are separated from each other. The first portion 31 that is a portion of the first semiconductor region 3 is present between the second semiconductor region 4 and the third semiconductor region 5 so as to surround the second semiconductor region 4. Therefore, it is possible to suppress shorting between the second semiconductor region 4 and the third semiconductor region 5. Thus, it is possible improve electrical characteristics.

The distance d1 between the inner edge and the outer edge of the second semiconductor region 4 is larger than the distance d2 between the outer edge of the second semiconductor region 4 and the inner edge of the third semiconductor region 5. Therefore, a variety of stress described above occurring in the through-hole 9B can be much more alleviated by the second semiconductor region.

The inner edge of the third semiconductor region 5 surrounds the aperture of the through-hole 9B on the rear surface 22 side when viewed from the thickness direction of the semiconductor substrate 2. That is, the third semiconductor region 5 is provided in an area located further outside than the through-hole 9B when viewed from the thickness direction of the semiconductor substrate 2. Therefore, when the bump electrode is formed within the through-hole 9B, or the like, it is possible to reduce stress applied to the third semiconductor region 5 constituting the light detection region.

Each of the photodiodes PD2 includes the contact electrode 82a formed on the surface 21 and connecting the third semiconductor region 5 and the through-electrode 81b, and the outer edge of the contact electrode 82a surrounds the aperture of the through-hole 9B on the rear surface 22 side when viewed from the thickness direction of the semiconductor substrate 2. That is, when viewed from the thickness direction of the semiconductor substrate 2, the contact electrode 82a is provided over the range of the inner side and the outer side of the through-hole 9B. Therefore, it is possible to improve strength in the vicinity of the through-hole 9B.

The aperture of the through-hole 9B on the surface 21 side exhibits a circular shape. Therefore, for example, when the bump electrode is formed within the through-hole 9B, or the like, it is possible to suppress the occurrence of stress concentration in the through-hole 9B. Further, the aperture of the through-hole 9B on the rear surface 22 side exhibits a circular shape. Therefore, it is possible to further suppress the occurrence of stress concentration in the through-hole 9B.

The second semiconductor region 4 exhibits a circular annular shape. Therefore, it is possible to suppress the concentration of an electric field as compared with a case where the second semiconductor region 4 exhibits a polygonal shape or the like.

Next, a photodiode array of still another embodiment will be described.

Figure 2:
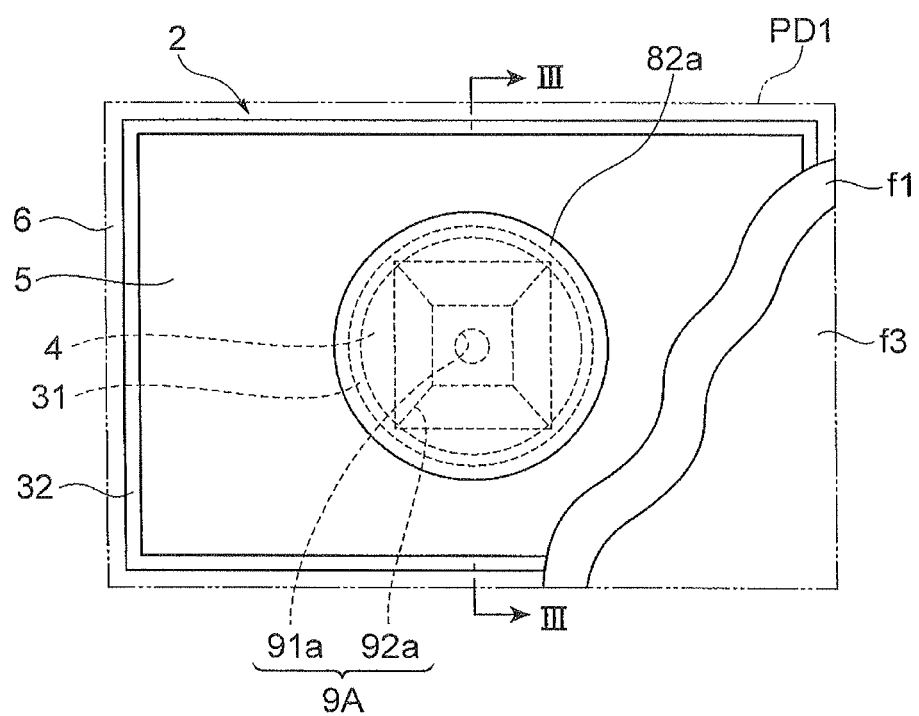
FIG. 2 is a plan view illustrating a photodiode of the photodiode array of FIG. 1.
Figure 15:
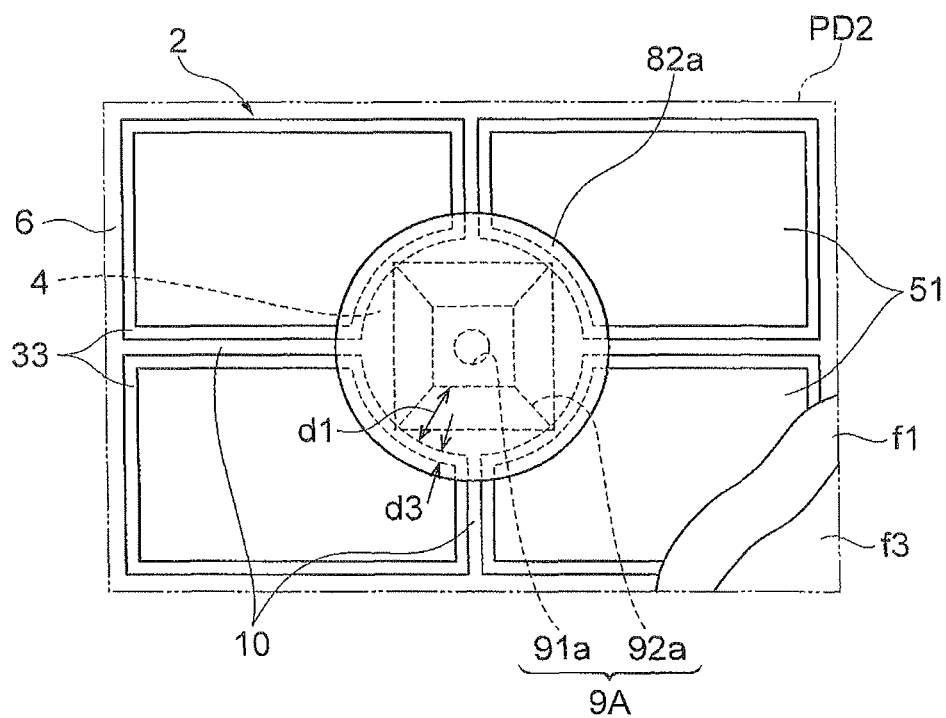
FIG. 15 is a plan view illustrating a photodiode of a photodiode array according to another embodiment of the present invention.

As shown in FIG. 15, the photodiode array of the present embodiment includes a photodiode PD3 in place of the aforementioned photodiode PD1 (see FIG. 2). The photodiode PD3 differs from the photodiode PD1, in that the light detection region is divided into a plurality of (four) pieces.

Specifically, the photodiode PD3 includes a plurality of (four) third semiconductor regions 51 having a shape different from that of the third semiconductor region 5, in place of the third semiconductor region 5. The photodiode PD3 includes a plurality of (four) third portions 33 which are a portion of the first semiconductor region 3, in place of the first and second portions 31 and 32. The photodiode PD3 includes a plurality of sixth semiconductor regions 10.

The plurality of third semiconductor regions 51 are provided so as to be separated from each other. The plurality of third semiconductor regions 51 surrounds the second semiconductor region 4 when viewed from the thickness direction of the semiconductor substrate 2. Each of the third semiconductor regions 51 is separated from the second semiconductor region 4. Each of the third semiconductor regions 51 exhibits a shape such as one corner being notched in a fan-like shape from a rectangle, when viewed from the thickness direction of the semiconductor substrate 2.

The distance d1 between the inner edge and the outer edge of the second semiconductor region 4 is larger than a distance d3 between the outer edge of the second semiconductor region 4 and the inner edge of the third semiconductor region 51 (distance between the inner edge and the outer edge in each of the third portions 33).

The inner edges of the plurality of third semiconductor regions 51 surround the aperture of the through-hole 9A on the rear surface 22 side when viewed from the thickness direction of the semiconductor substrate 2. That is, the plurality of third semiconductor regions 51 are provided further outside than the through-hole 9A when viewed from the thickness direction of the semiconductor substrate 2.

Each of the third semiconductor regions 51 is connected to the contact electrode 82a. Information obtained in the plurality of third semiconductor regions 51 is output as one piece of information from the through-electrode 81a. That is, the photo diode PD3 including the plurality of third semiconductor regions 51 functions as one pixel.

Each of the third portions 33 exhibits an annular shape. Each of the third portions 33 surrounds the third semiconductor region 51 when viewed from the thickness direction of the semiconductor substrate 2. The plurality of third portions 33 are provided so as to be separated from each other. The plurality of third portions 33 surrounds the second semiconductor region 4 when viewed from the thickness direction of the semiconductor substrate 2.

The sixth semiconductor regions 10 are provided with respect to the first semiconductor region 3 on the surface 21 side of the semiconductor substrate 2. Each of the sixth semiconductor regions 10 is formed between the adjacent third portions 33 and 33 when viewed from the thickness direction of the semiconductor substrate 2. The sixth semiconductor region 10 exhibits an approximately rectangular shape when viewed from the thickness direction of the semiconductor substrate 2. The sixth semiconductor region 10 is an $n^+$-type semiconductor region, and has an impurity concentration higher than the impurity concentration of the first semiconductor region 3. The sixth semiconductor region 10 is provided continuously with the second semiconductor region 4 and the fourth semiconductor region 6 which are $n^+$-type semiconductor regions. The sixth semiconductor region 10 has, for example, approximately the same thickness and impurity concentration as those of the second semiconductor region 4 and the fourth semiconductor region 6. The second semiconductor region 4 is formed, for example, by diffusing an n-type impurity into Si, or the like. The second semiconductor region 4 is, for example, formed simultaneously with the second semiconductor region 4 and the fourth semiconductor region 6 in the aforementioned manufacturing method.

The photodiode array including a plurality of photodiodes PD3 described above exhibits the same effect as that in the aforementioned photodiode array 1. Particularly, also in the photodiode array of the present embodiment, in each of the photodiodes PD3, the through-hole 9A passes through the first semiconductor region 3 and the second semiconductor region 4, and the second semiconductor region 4 is surrounded by the plurality of third semiconductor regions 51. The plurality of third semiconductor regions 51 constitutes the light detection region together with the first semiconductor region 3. Here, in each photodiode PD3 which is one pixel, the through-hole 9A is surrounded by the light detection region. Thereby, a distance between the adjacent photodiodes PD3 and PD3 is reduced. Thus, it is possible to improve an aperture ratio.

In the photodiode PD3, the second semiconductor region 4 is formed continuously with the fourth semiconductor region 6 which is grounded, through the sixth semiconductor region 10. Therefore, in the photodiode PD3, it is possible to improve electrical stability as compared with the aforementioned photodiode PD1.

Next, a photodiode array of still another embodiment will be described.

Figure 16:
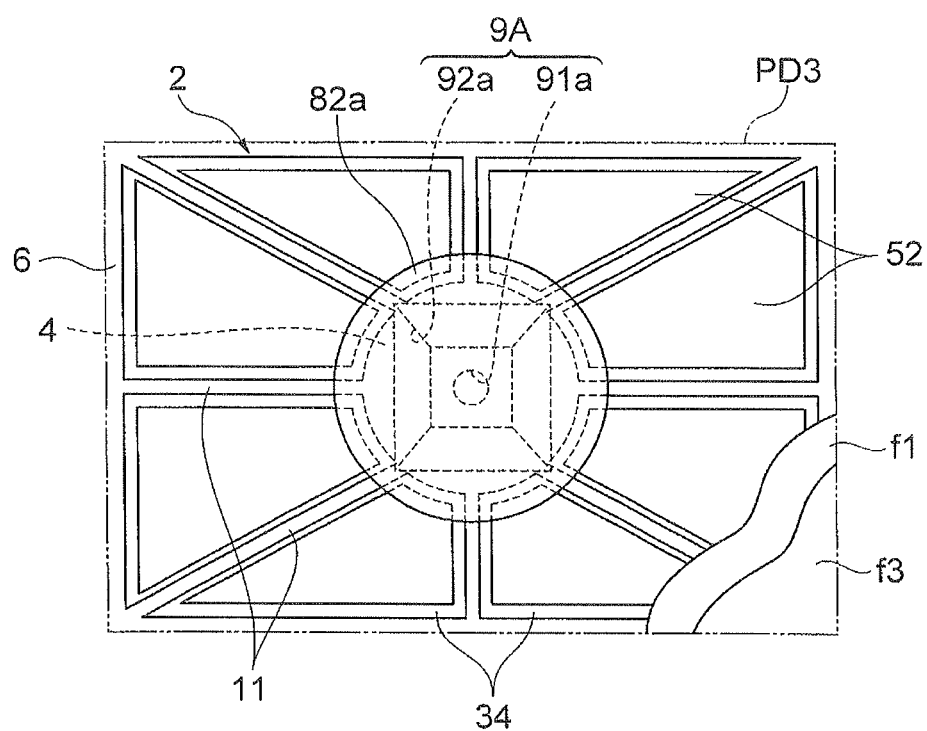
FIG. 16 is a plan view illustrating a photodiode of a photodiode array according to another embodiment of the present invention.

As shown in FIG. 16, in a photodiode PD4 in the photodiode array of the present embodiment, the number of divisions of the light detection region differs from that in the aforementioned photodiode PD3 (see FIG. 15).

Specifically, the photodiode PD4 includes a plurality of (eight) third semiconductor regions 52 in place of the plurality of (four) third semiconductor regions 51. The third semiconductor region 52 exhibits an approximately quadrangular shape when viewed from the thickness direction of the semiconductor substrate 2. The photodiode PD4 includes a plurality of (eight) third portions 34 in place of the plurality of (four) third portions 33. The third portion 34 exhibits an approximately quadrangular annular shape when viewed from the thickness direction of the semiconductor substrate 2. The photodiode PD4 includes a plurality of (eight) sixth semiconductor regions 11 in place of the plurality of (four) sixth semiconductor regions 10. The sixth semiconductor region 11 exhibits an approximately rectangular shape when viewed from the thickness direction of the semiconductor substrate 2.

The photodiode array including a plurality of such photodiodes PD4 exhibits the same effect as that in the photodiode array including the plurality of photodiodes PD3 described above.

As described above, the embodiments of the present invention have been described, but the present invention is not limited to the embodiments. For example, when the light detection region is divided, the number of divisions can be changed to various numbers without being limited to four and eight. In addition, the material and shape of each configuration of the photodiode array can be changed to various materials and shapes without being limited to the above-mentioned materials and shapes.

Each conductivity type of the p-type and the n-type in the photodiode array may be reversed with respect to the aforementioned types. The photodiode array may be photodiodes which are arrayed one-dimensionally without being limited to the photodiodes PD1 to PD4 which are arrayed two-dimensionally. The photodiode array can be applied to various apparatuses without being limited to the CT apparatus.

INDUSTRIAL APPLICABILITY

According to the present invention, it is possible to provide a photodiode array which is capable of improving an aperture ratio and reliability.

REFERENCE SIGNS LIST

1: photodiode array, 2: semiconductor substrate, 3: first semiconductor region, 4: second semiconductor region, 5: third semiconductor region, 9A, 9B: through-hole, 81a, 81b: through-electrode, 82a: contact electrode, PD1 to PD4: photodiode

The invention claimed is:

1. A photodiode array comprising a plurality of photodiodes formed in a semiconductor substrate,
wherein the semiconductor substrate comprises a first surface and a second surface, and
each of the plurality of photodiodes includes:
a first semiconductor region of a first conductivity type disposed in the semiconductor substrate;
a second semiconductor region of the first conductivity type disposed in the semiconductor substrate, the second semiconductor region being situated in the first semiconductor region toward the first surface, and having an impurity concentration higher than an impurity concentration of the first semiconductor region;
a third semiconductor region of a second conductivity type disposed in the semiconductor substrate, the third semiconductor region being larger than the second semiconductor region when viewed from a thickness direction of the semiconductor substrate, being situated in the first semiconductor region toward the first surface, surrounding the second semiconductor region, constituting a light detection region together with the first semiconductor region, and forming a pn junction with the first semiconductor region;
a portion of the first semiconductor region disposed between the second semiconductor region and the third semiconductor region, the portion of the first semiconductor region, the second semiconductor region, and the third semiconductor region being disposed along the first surface of the semiconductor substrate; and
a through-electrode disposed within a through-hole passing through the first surface and the second surface of the semiconductor substrate, the first semiconductor region, and the second semiconductor region, the through-electrode extending over the second semiconductor region and of the portion of the first semiconductor region, and the through-electrode being electrically connected to the third semiconductor region, and
the second semiconductor region being in direct contact with an insulating layer of the through-hole, being completely spaced apart from the third semiconductor region, and being surrounded by one or more third semiconductor region portions electrically connected to the through-electrode so that the second semiconductor region is surrounded by one monolithic third semiconductor region, or so that the second semiconductor region is surrounded by the one or more third semiconductor region portions that are electrically connected to the same through-electrode.

2. The photodiode array according to claim 1, wherein a distance between an inner edge and an outer edge of the second semiconductor region is larger than a distance between the outer edge of the second semiconductor region and an inner edge of the third semiconductor region.

3. The photodiode array according to claim 1, wherein an inner edge of the third semiconductor region surrounds an aperture of the through-hole on the second surface when viewed from the thickness direction of the semiconductor substrate.

4. The photodiode array according to claim 1, wherein each of the plurality of photodiodes includes a contact electrode formed on the first surface and electrically connecting the third semiconductor region and the through-electrode, and
an outer edge of the contact electrode surrounds an aperture of the through-hole on the second surface when viewed from the thickness direction of the semiconductor substrate.

5. The photodiode array according to claim 1, wherein an aperture of the through-hole on the first surface exhibits a circular shape.

6. The photodiode array according to claim 1, wherein the third semiconductor region is separated from a peripheral circumference of the second semiconductor region, the second semiconductor region having a depth that is larger than a depth of the third semiconductor region.

7. The photodiode array according to claim 1, wherein the through-electrode is physically in contact with the third semiconductor region.

8. The photodiode array according to claim 1, further comprising a fourth semiconductor region, wherein the third semiconductor region is physically separate from the fourth semiconductor region, and the third semiconductor region has a depth that is smaller than the depth of the second semiconductor region and the fourth semiconductor region.

* * * * *